United States Patent
Mizushima

(10) Patent No.: US 8,125,010 B2
(45) Date of Patent: Feb. 28, 2012

(54) SEMICONDUCTOR DEVICE

(75) Inventor: Hiroaki Mizushima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 234 days.

(21) Appl. No.: 12/585,040

(22) Filed: Sep. 1, 2009

(65) Prior Publication Data

US 2010/0059806 A1 Mar. 11, 2010

(30) Foreign Application Priority Data

Sep. 9, 2008 (JP) ................................. 2008-230572

(51) Int. Cl.
*H01L 31/062* (2006.01)
(52) U.S. Cl. ........ 257/295; 257/296; 257/297; 257/298; 257/300
(58) Field of Classification Search ........... 257/295–315
See application file for complete search history.

(56) References Cited

U.S. PATENT DOCUMENTS

2008/0042181 A1 2/2008 Watarai et al.

FOREIGN PATENT DOCUMENTS

| JP | 2004-119857 A | 4/2004 |
| JP | 2008-47811 A | 2/2008 |

*Primary Examiner* — Samuel Gebremariam
(74) *Attorney, Agent, or Firm* — McGinn IP Law Group, PLLC

(57) ABSTRACT

A semiconductor device is proposed in which signal delay due to compensation capacitance elements in peripheral circuit element regions is eliminated. The semiconductor device includes: a first region including memory cells; a second region 10 including a functional circuit; cell capacitors formed in the first region; and compensation capacitance elements 36 to 38 formed in the second region 10, wherein the compensation capacitance elements 36 to 38 each include a lower electrode 36, a capacitance insulating film 37, and an upper electrode 38, the lower electrode 36, capacitance insulating film 37, and upper electrode 38 being the same as those of the cell capacitors, and wherein the compensation capacitance elements are formed over an upper layer of the second region 10 excluding upper layer portions of drain diffusion layers 44, 46 or gate electrodes 32 of transistors in the functional circuit.

7 Claims, 7 Drawing Sheets

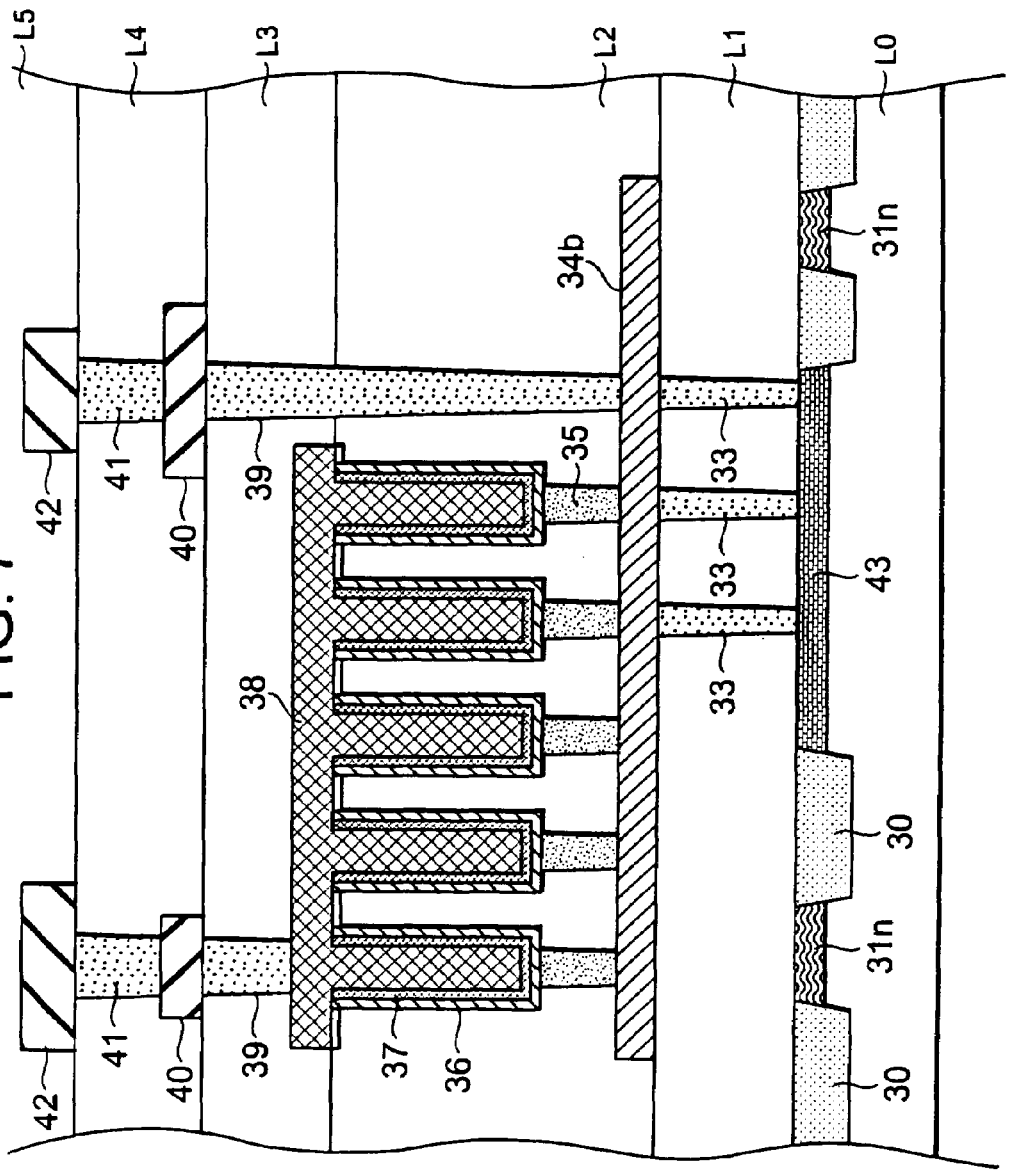

SEMICONDUCTOR DEVICE

BACKGROUND OF THE INVENTION

1. Field of the Invention

The present invention relates to a semiconductor device, and more particularly, to a semiconductor device incorporating compensation capacitance elements connected between two wirings for compensating a potential variation in wirings.

2. Description of the Related Art

Due to an increase in circuit scale and operation speed of semiconductor devices in recent years, consumption current is increasing. Thus, a variation in supply voltage has been increased. On the other hand, there has been an increasing trend to lower the operating supply voltage for semiconductor devices. In such semiconductor devices, however, since even a slight variation in supply voltage has a great impact on the supply voltage, a problem comes to the surface that the variation in supply voltage causes an unstable circuit operation.

Therefore, it has been proposed that compensation capacitance elements provided between a power supply wiring and a ground wiring of the semiconductor device for suppressing the variation in supply voltage are embedded in the semiconductor device. By embedding the compensation capacitance elements in the semiconductor device in this manner, it is possible to efficiently suppress the variation in supply voltage in the semiconductor device. Japanese Patent Laid-Open Nos. 2004-119857 and 2008-47811 disclose examples of semiconductor devices incorporating compensation capacitance elements.

Japanese Patent Laid-Open No. 2004-119857 discloses a semiconductor device having memory cells and active circuits, in which compensation capacitance elements are formed in regions other than the regions where the memory cells are arranged, and the compensation capacitance elements have almost the same pattern as capacitors of the memory cells. Japanese Patent Laid-Open No. 2008-47811 discloses a semiconductor device on which a Dynamic Random Access Memory (DRAM) region and a logic region are combined, in which compensation capacitance elements are formed in the logic region. As described above, according to these patent documents, the compensation capacitance elements are formed in regions other than the regions where the memory cells are arranged, so that a larger capacitance value is obtained.

However, if the compensation capacitance elements are disposed in the vicinity of signal paths in the case where the compensation capacitance elements are formed in regions other than the regions where the memory cells are arranged, as disclosed in Japanese Patent Laid-Open Nos. 2004-119857 and 2008-47811, parasitic capacitance in the signal paths is increased. The increased parasitic capacitance thus increases signal delay. Such signal delay may cause malfunction of the circuits. In particular, in the semiconductor devices in which the demand for high-speed operation is growing in recent years, the problem of signal delay has become pronounced.

SUMMARY OF THE INVENTION

Accordingly, it is an object of the present invention to provide a semiconductor device which can stabilize the supply voltage of the semiconductor device without causing an increase in signal delay.

According to an aspect of the invention, there is provided a semiconductor device including: a first region including memory cells; a second region including a functional circuit; cell capacitors formed in the first region; and compensation capacitance elements formed in the second region, wherein the compensation capacitance element includes a lower electrode, a capacitance insulating film, and an upper electrode, the lower electrode, capacitance insulating film, and upper electrode being the same as those of the cell capacitors, and wherein the compensation capacitance elements are formed over an upper layer of the second region excluding upper layer portions of drain diffusion layers or gate electrodes of transistors in the functional circuit.

In the semiconductor device according to the aspect of the present invention, the compensation capacitance elements are formed over an upper layer of the second region excluding upper layer portions of the drain diffusion layers or the gate electrodes of the transistors. This makes it possible to prevent an increase in parasitic capacitance in signal paths of the functional circuit. That is to say, in the semiconductor device according to the aspect of the present invention, it is possible to form larger compensation capacitance elements while suppressing signal delay in signal paths.

BRIEF DESCRIPTION OF THE DRAWINGS

FIG. 7 is a sectional view of the semiconductor device according to the second embodiment taken along line VII-VII of FIG. 6.

DETAILED DESCRIPTION OF THE PREFERRED EMBODIMENTS

First Embodiment

Figure 1:
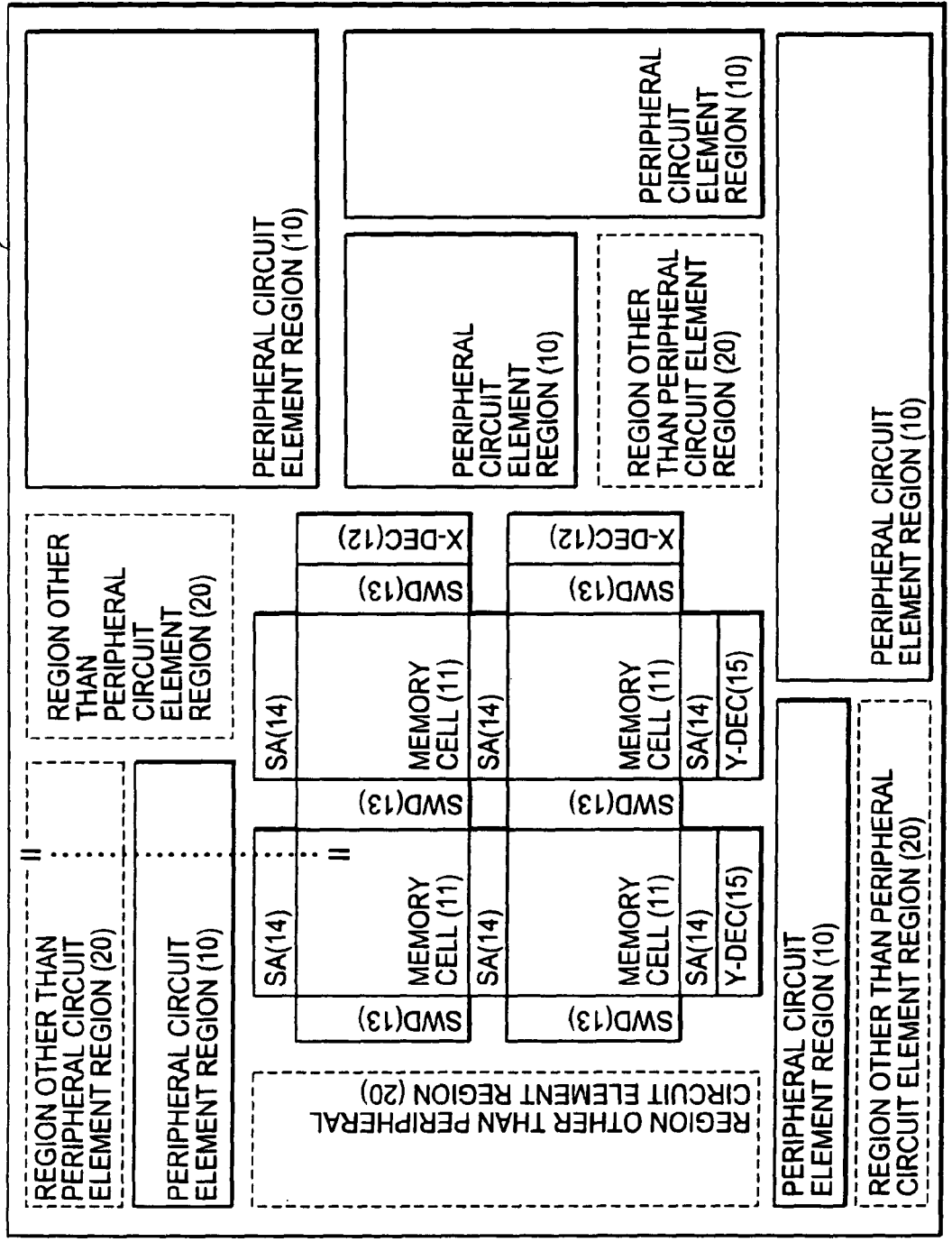
FIG. 1 is a schematic view of a semiconductor device according to a first embodiment.

Hereinafter, a first embodiment of the present invention will be described with reference to the accompanying drawings. FIG. 1 shows a schematic view of a semiconductor device 1 according to the first embodiment. As shown in FIG. 1, the semiconductor device 1 includes second regions (e.g. peripheral circuit element regions) 10, third regions (e.g. regions other than the peripheral circuit element regions) 20, and a first region (e.g. memory cell region).

In each of the peripheral circuit element regions 10, a functional circuit for realizing the function of the semiconductor device 1 is disposed. The functional circuit includes transistors, resistors, and capacitors. The capacitors include compensation capacitance elements for suppressing a variation in supply voltage. In each of the regions 20 other than the peripheral circuit element regions, no semiconductor elements forming a functional circuit are disposed, that is, the regions 20 are so-called free spaces. In this embodiment, therefore, the compensation capacitance elements are also disposed in the free spaces.

In the memory cell region, there are provided memory cells 11, word line address decoders 12 (X-DEC in FIG. 1), word line control circuits 13 (SWD in FIG. 1), sense amplifiers 14 (SA in FIG. 1), and bit-line address decoders 15 (Y-DEC in FIG. 1). Also, a memory disposed in the memory cell region serves as a storage region of the semiconductor device 1 or for an externally connected device.

The memory cells 11 are arranged in a lattice shape. In this embodiment, Dynamic Random Access Memory (DRAM) cells are used as memory cells to be arranged. Therefore, each of the memory cells 11 is provided with a cell capacitor for storing data, and a gate transistor for controlling input and output of current to and from the cell capacitor. The word line address decoders 12 control the word line control circuits 13 under a control signal obtained by decoding a word line address inputted from another circuit. The word line control circuits 13 activate a word line according to the control signal. Then, the gate transistor connected to the activated word line comes into conduction to access the cell capacitor. The sense amplifiers 14 amplify a signal read out from the memory cells connected to the activated word line. The bit-line address decoders 15 control which bit line to read out or write data from or to by decoding a bit-line address inputted from another circuit.

Figure 2:
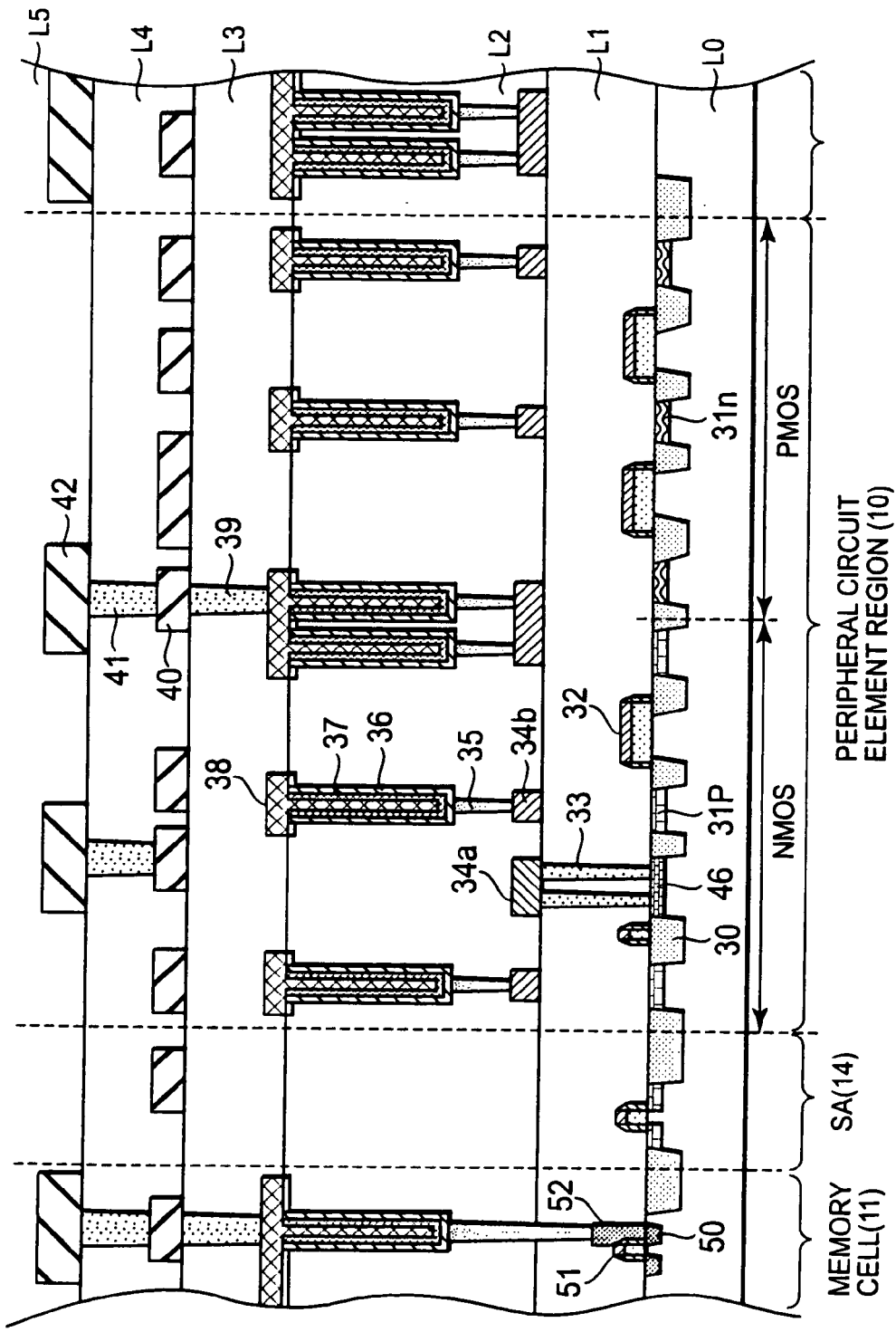
FIG. 2 is a sectional view of the semiconductor device according to the first embodiment taken along line II-II of FIG. 1.

Here, it should be noted that the features of the semiconductor device 1 according to the first embodiment include the layout of the compensation capacitance elements. Therefore, with reference to FIG. 2 showing a sectional view of the semiconductor device 1 taken along line II-II of FIG. 1, the layout of the compensation capacitance elements of the semiconductor device 1 according to the first embodiment will now be described. In FIG. 2, identical elements are designated by similar hatching on each layer, and thus its detailed description is not provided herein.

The sectional view shown in FIG. 2 illustrates the memory cell 11, the sense amplifier 14, the peripheral circuit element region 10, and the region 20 other than the peripheral circuit element region. Also, as shown in FIG. 2, the semiconductor device 1 is composed of plural layers (L0 to L5 in FIG. 2). In a semiconductor substrate layer L0, in the vicinity of the surface of the semiconductor substrate layer L0 formed of a P-type semiconductor, there are formed element isolation regions 30, sub-contact regions 31p, well contact regions 31n, drain diffusion layers 46, and cell diffusion layers 50. Each of the element isolation regions 30 is an insulating film made of, for example, an oxide film. The sub-contact regions 31p are formed in the N-channel metal oxide semiconductor (NMOS) formation region of the peripheral circuit element region 10 and the sense amplifier 14. Each of the sub-contact regions 31p is a diffusion region formed of the P-type semiconductor, and is connected to a ground wiring for applying a ground potential to back gates of n-type transistors, and a semiconductor substrate. The well contact regions 31n are formed in the P-channel metal oxide semiconductor (PMOS) formation region of the peripheral circuit element region 10. Each of the well contact regions 31n is a diffusion region formed of an n-type semiconductor, and is connected to a power supply wiring for applying a power supply potential to back gates of p-type transistors. The drain diffusion layers 46 are diffusion regions to form drain terminals of the transistors. The cell diffusion layers 50 are the source and drain diffusion layers of the gate transistor of the memory cell 11.

A substrate surface layer L1 is formed on the semiconductor substrate layer L0. In the substrate surface layer L1, there are formed gate electrodes 32, contact wirings 33, cell gates 51, and cell contact wirings 52. The gate electrodes 32 are gate electrodes of the transistors disposed in the peripheral circuit element region 10. Each of the gate electrodes 32 is composed of a gate oxide film, a gate electrode material, and side walls. The contact wirings 33 are vertical wirings for connecting a wiring formed on the upper layer of the substrate surface layer L1 and elements formed on the semiconductor substrate layer L0. Each of the cell gates 51 is a gate electrode of the gate transistor of the memory cell 11, and is composed of a gate oxide film, a gate electrode material, and side walls. The cell contact wiring 52 is a wiring for connecting the cell diffusion layers 50 and a wiring formed on an upper layer of the substrate surface layer L1.

A first wiring layer L2 is formed on the substrate surface layer L1. In the first wiring layer L2, there are formed first metal wirings 34a and 34b, capacitance contacts 35, the cell capacitors, and the compensation capacitance elements. The first metal wiring 34a is, for example, a signal wiring, and the first metal wirings 34b is, for example, ground wirings. In this embodiment, the first metal wiring 34a is connected to the drain diffusion layers 46 of the transistors through the contact wirings 33. Each of the first metal wirings 34b is connected to the compensation capacitance element through the capacitance contact 35.

The cell capacitor and the compensation capacitance elements each include a lower electrode 36 formed along the inner wall and bottom face of each of channels formed on the first wiring layer L2, a capacitance insulating film 37 formed on the inner side of the lower electrode 36, and an upper electrode 38 formed on the inner side of the capacitance insulating film 37. The upper electrode 38 is formed with a surface thereof exposed at a second wiring layer L3 formed on the first wiring layer L2. The cell capacitor is formed in the memory cell 11. Also, the cell capacitor is provided with the lower electrode 36 connected to the gate transistor, and the upper electrode 38 connected to a reference voltage supply. On the other hand, the compensation capacitance elements are formed in the peripheral circuit element region 10 and the region 20 other than the peripheral circuit element region. Each of the compensation capacitance elements is provided with the lower electrode 36 connected to a ground wiring, and the upper electrode 38 connected to a power supply wiring. That is to say, the cell capacitor and the compensation capacitance elements have the same configuration, however, are disposed in different regions and connected to different wirings.

Furthermore, in this embodiment, the compensation capacitance elements formed in the region 20 other than the peripheral circuit element region are formed over the region 20. On the other hand, the compensation capacitance elements formed in the peripheral circuit element region 10 are formed in the regions excluding the upper layer portions of at least one of the drain diffusion layers 46 and the gate electrodes 32 of the transistors. More specifically, the compensation capacitance elements formed in the peripheral circuit element region 10 are formed above the sub-contact regions 31p and the well contact regions 31n.

In the second wiring layer L3, there are formed the upper electrodes 38 and first via wirings 39 of the cell capacitor and the compensation capacitance elements. The first via wirings 39 are vertical wirings for connecting the upper electrodes 38 of the cell capacitor and the compensation capacitance elements, and respective metal wirings formed on an upper layer of the second wiring layer L3. In a third wiring layer L4, the second metal wirings 40 and second via wirings 41 are formed. Each of the second metal wirings 40 includes a signal wiring and an intermediate wiring. The signal wiring is a wiring for transmitting a signal between semiconductor elements such as transistors. The intermediate wiring is a wiring for connecting the wirings on the lower layer and the upper layer. In the third wiring layer L5, third metal wirings 42 are formed. Each of the third metal wirings 42 includes a power supply wiring and a reference voltage wiring. The power supply wiring is a wiring for supplying power to the semiconductor elements, and the reference voltage wiring is a wiring for supplying a reference voltage to the upper electrode of the cell capacitor of the memory cell 11.

Figure 3:
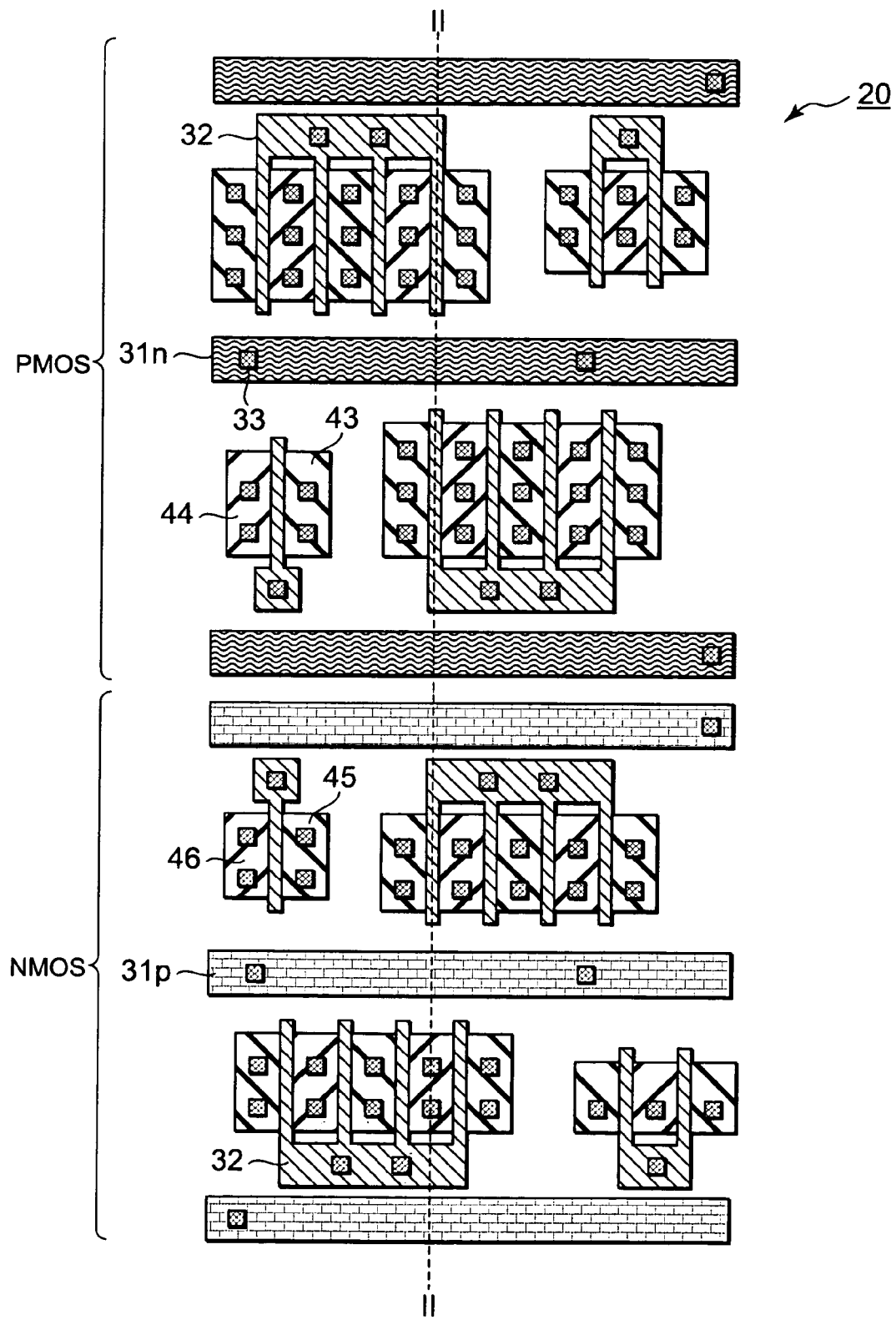
FIG. 3 is a plan layout sketch, without compensation capacitance elements, of a peripheral circuit element region of the semiconductor device according to the first embodiment.

Next, the layout method of the compensation capacitance elements in the peripheral circuit element region 10 will be further described in detail. FIG. 3 is a plan layout sketch of the peripheral circuit element region 10 in the vicinity of the sectional view shown in FIG. 2. The section of the semiconductor device taken along line II-II in FIG. 3 corresponds to the sectional view of FIG. 2. FIG. 3 illustrates a plan layout sketch of the transistors and the diffusion layers for the transistors. As shown in FIG. 3, PMOS and NMOS transistors are disposed in PMOS and NMOS regions, respectively. In this embodiment, the well contact regions 31n and the sub-contact regions 31p each extend laterally in FIG. 3. Also, the PMOS transistors are disposed in the regions sandwiched between the well contact regions 31n, and the NMOS transistors are disposed in the regions sandwiched between the sub-contact regions 31p.

Each of the PMOS transistors includes the gate electrode 32, a source diffusion layer 43, and a drain diffusion layer 44. The source diffusion layer 43 and the drain diffusion layer 44 are formed of, for example, the P-type semiconductor. Each of the NMOS transistors includes the gate electrode 32, a source diffusion layer 45, and the drain diffusion layer 46. The source diffusion layer 45 and the drain diffusion layer 46 are formed of, for example, the N-type semiconductor. Also, the gate electrodes 32, the source diffusion layers 43 and 45, the drain diffusion layers 44 and 46, the sub-contact regions 31p, and the well contact regions 31n of the transistors are provided with the respective contact wirings 33, and each connected to a corresponding wiring through the contact wirings 33.

Figure 4:
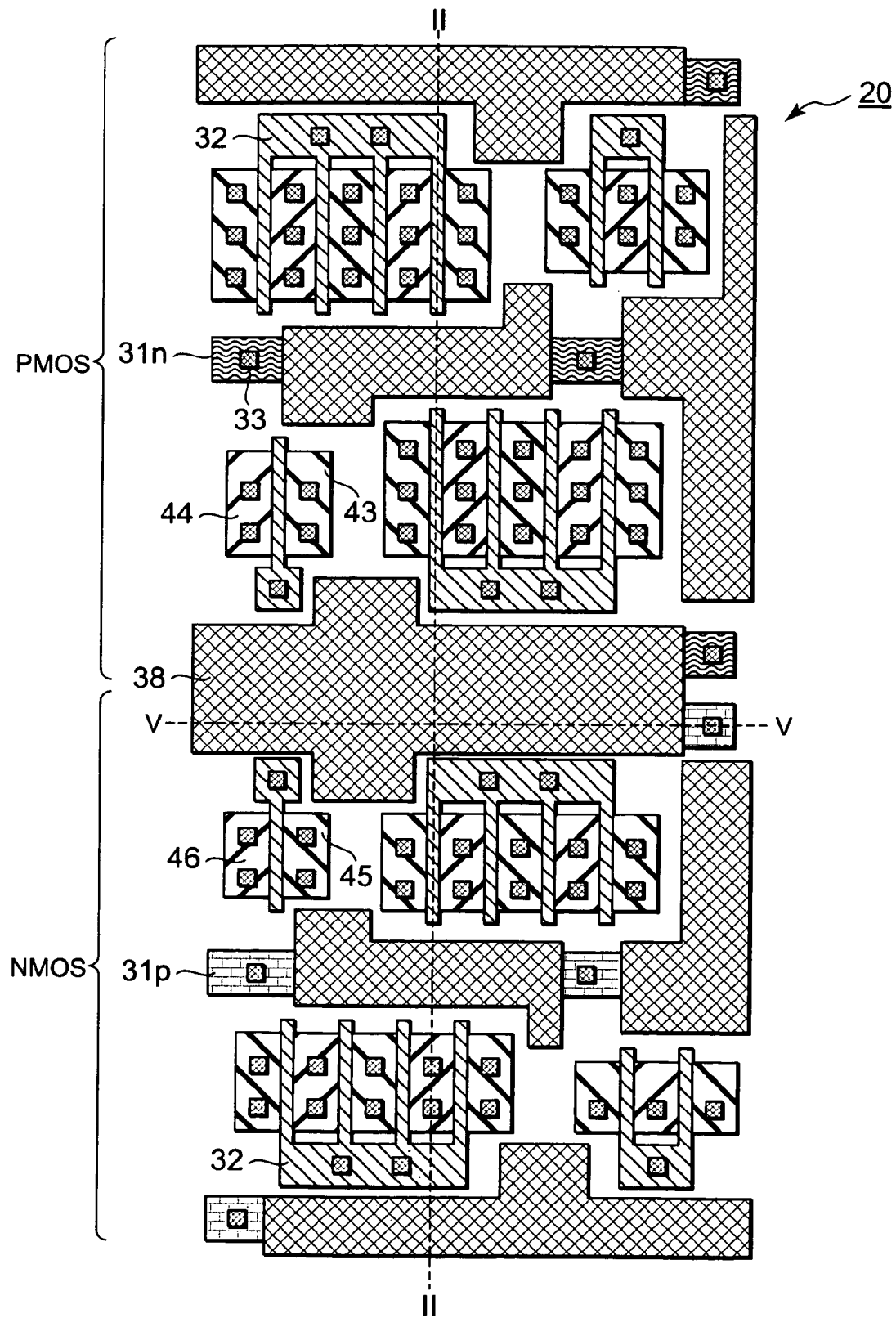
FIG. 4 is a plan layout sketch, with compensation capacitance elements, of the peripheral circuit element region of the semiconductor device according to the first embodiment.

Next, FIG. 4 illustrates a plan layout sketch with the compensation capacitance elements provided in the plan layout sketch shown in FIG. 3. The sectional view taken along line II-II in FIG. 4 corresponds to the sectional view of FIG. 2. In the semiconductor device 1 according to the first embodiment, as shown in FIG. 4, the compensation capacitance elements provided in the peripheral circuit element region 10 are disposed above the well contact regions 31n and the sub-contact regions 31p, and in the regions excluding the upper layer portions of the transistors. FIG. 4 illustrates the layout of the upper electrodes 38 of the compensation capacitance elements. The channels are formed under the upper electrodes 38, and the compensation capacitance elements are formed by utilizing the channels.

Figure 5:
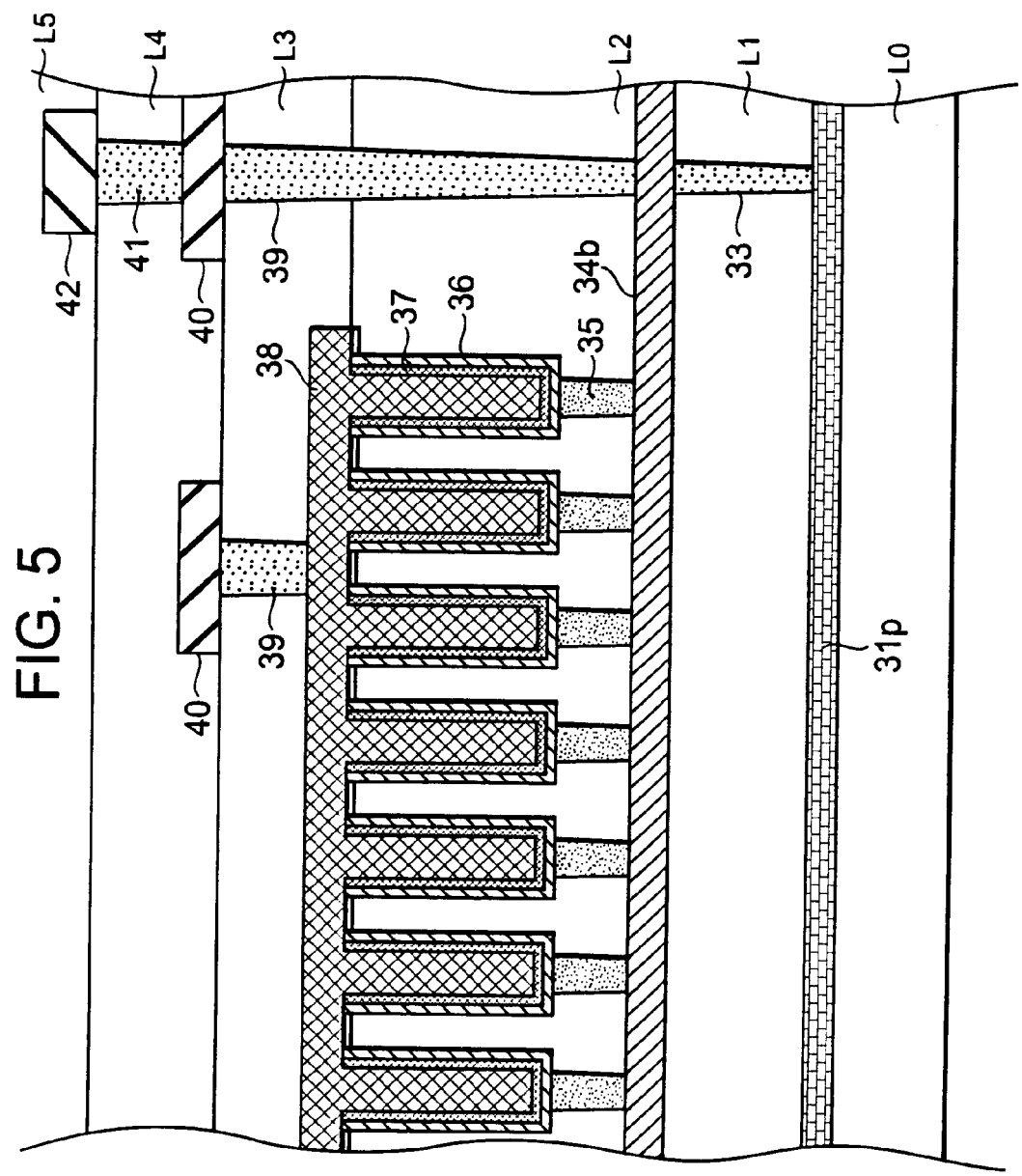
FIG. 5 is a sectional view of the semiconductor device according to the first embodiment taken along line V-V of FIG. 4.

FIG. 5 illustrates a sectional view taken along line V-V of FIG. 4, for explaining the configuration of the compensation capacitance elements. In the figure, the same reference numerals as those in FIG. 2 designate respective elements, and the detailed descriptions thereof will not be repeated. As shown in FIG. 5, the plural channels are formed according to the distance where the upper electrode 38 continues, and the compensation capacitance element is formed in each of the channels. The compensation capacitance element is formed by utilizing the channel in this manner, thereby allowing increasing of the surface area of the capacitance element and enhancing of the efficiency of a capacitance value of the capacitance element obtained from a layout area.

In the semiconductor device 1 according to the first embodiment, as described above, the compensation capacitance elements are formed above the well contact regions 31n and the sub-contact regions 31p, and in the regions excluding the upper layer portions of the transistors, of the peripheral circuit element region 10. A ground voltage or a supply voltage, which is a DC voltage, is supplied to the well contact regions 31n and the sub-contact regions 31p. Therefore, even if the compensation capacitance elements are disposed above the well contact regions 31n and the sub-contact regions 31p, it is possible to provide a large distance between the signal wirings to which a signal with an AC voltage or a voltage variation is transmitted and the compensation capacitance elements. For this reason, in the semiconductor device 1, there is no problem of increasing parasitic capacitance causing an increase in signal delay.

Furthermore, in the semiconductor device 1 according to the first embodiment, since the compensation capacitance elements are disposed in the regions excluding the upper layer portions of the transistors, it is possible to provide a large distance between the drain terminals and gate electrodes where a potential variation occurs in the transistors, and the compensation capacitance elements. According to the semiconductor device 1, therefore, even if the compensation capacitance elements are provided, the parasitic capacitances of the drain terminals and the gate electrodes of the transistors are not increased. In other words, since the parasitic capacitances in the transistors as well as the signal wirings are not increased, the semiconductor device 1 has no problem of an increase in signal delay. Also, if the increase in signal delay can be limited within an allowable range, the compensation capacitance elements may be disposed above the drain diffusion layers or the gate electrodes. In particular, in order to meet the demand on a variation in supply voltage rather than a signal delay, it is effective to expand the compensation capacitance element area. However, in order to meet the demand on a signal delay, it is preferable to avoid disposing the compensation capacitance elements above the drain diffusion layers and the gate electrodes.

On the other hand, in the semiconductor device 1, the compensation capacitance elements are disposed above the well contact regions 31n to which the supply voltage is supplied, and the sub-contact regions 31p to which the ground voltage is supplied. Therefore, it is possible to reduce the distances between the lower electrode of the compensation capacitance element and the ground wiring, and between the upper electrode of the compensation capacitance element and the power supply wiring. For this reason, the compensation capacitance element disposed in the peripheral circuit element region is connected to the ground wiring and the power supply wiring with low wiring resistance. Thus, according to the semiconductor device 1, a potential variation in the power supply wiring can be efficiently suppressed using the compensation capacitance elements.

Also, since the compensation capacitance elements employed in the semiconductor device 1 have the same configuration as the cell capacitors formed in the memory cell region, new production processes to form the compensation capacitance elements are unnecessary. In addition, each of the compensation capacitance elements is configured utilizing the channel, thereby allowing enhancing of the efficiency of a capacitance value obtained from the layout area.

Second Embodiment

Figure 6:
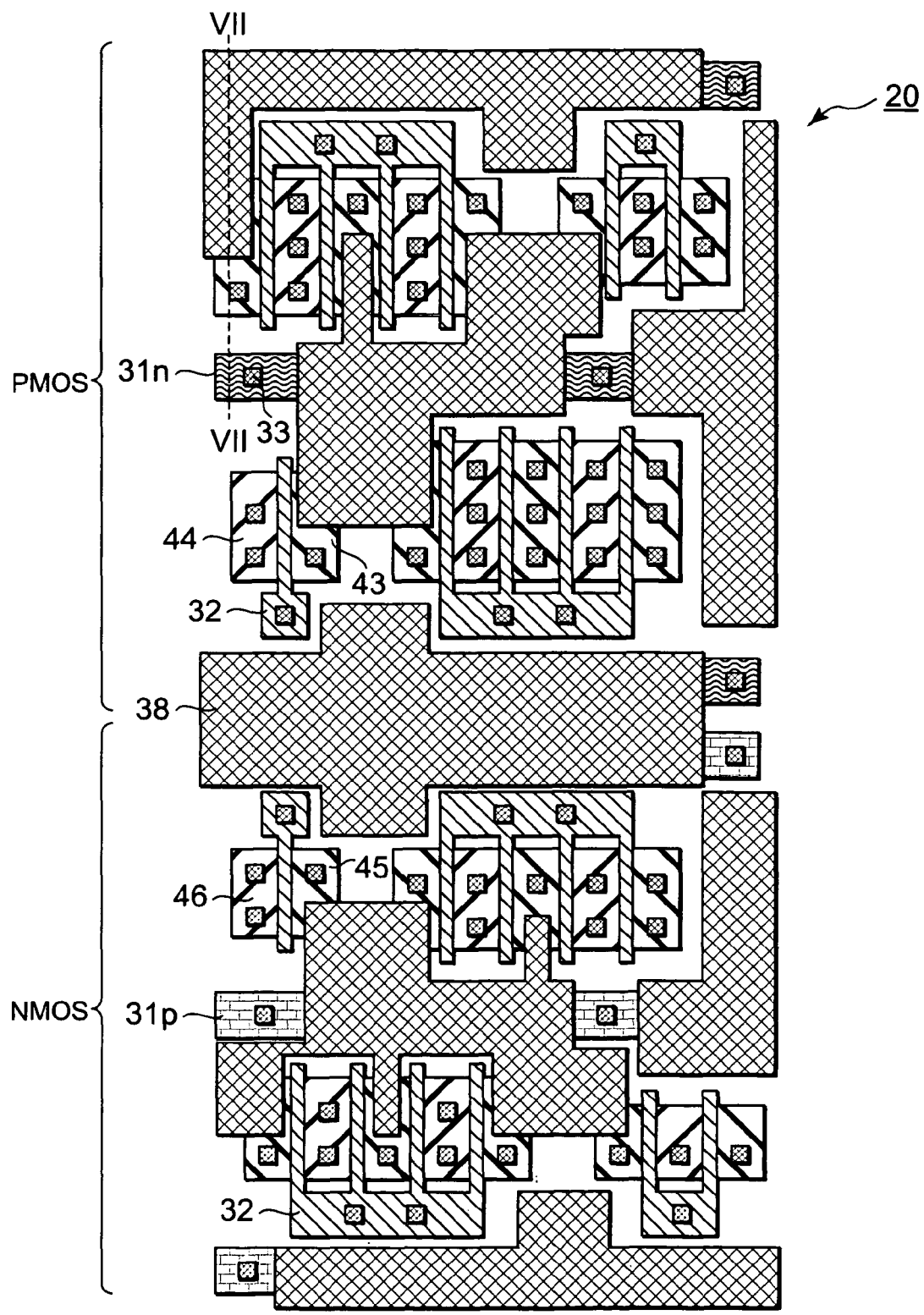
FIG. 6 is a plan layout sketch of a semiconductor device according to a second embodiment.

FIG. 6 illustrates an example of the plan layout of compensation capacitance elements on a semiconductor device according to a second embodiment of the present invention. FIG. 6 is the modified plan layout of the plan layout of FIG. 4, in accordance with the second embodiment. Although the compensation capacitance elements according to the first embodiment are disposed in the regions on the peripheral circuit element region 10 excluding the upper layer portions of the transistors, the compensation capacitance elements according to the second embodiment are also disposed above the source diffusion layers of the transistors, as well as in the former regions.

In the plan layout according to the second embodiment, as shown in FIG. 6, the compensation capacitance elements are also disposed above a part of the source diffusion layers of the transistors provided in the peripheral circuit element region 10. By expanding the layout regions of the compensation capacitance elements in this manner, the capacitance values of the compensation capacitance elements can be increased. The larger capacitance value of the compensation capacitance elements, the more potential variation suppressing effect is obtained. Therefore, the semiconductor device according to the second embodiment can suppress a potential variation more efficiently than the semiconductor device according to the first embodiment.

FIG. 7 is a sectional view of the semiconductor device taken along line VII-VII of FIG. 6. According to the second embodiment, as shown in FIG. 6, the compensation capacitance elements (each including the lower electrode 36, the capacitance insulating film 37, and the upper electrode 38) are formed above the well contact regions 31n and the source diffusion layers 43. Referring to the sectional view of FIG. 7, the compensation capacitance elements do not entirely cover the source diffusion layer 43, and are formed in regions excluding a portion of the upper layer portion of the source diffusion layer 43. Also, by utilizing a region where no compensation capacitance element is formed above the source diffusion layer 43, the first via wiring 39 for supplying power to the source diffusion layer 43 and the contact wiring 33 are formed.

Also in the second embodiment, the compensation capacitance elements are not disposed above the drain diffusion layers of the transistors, in the same manner as the first embodiment. Thus, also in the second embodiment, it is possible to prevent an increase in parasitic capacitance parasitic on the drain terminals of the transistors.

It should be understood that the present invention is not limited to the above-described embodiments and modifications may be made without departing from the scope of the present invention. Therefore, the compensation capacitance elements described in these embodiments may be employed for the purposes other than power supply stabilization, for example, as time constant circuits for setting a predetermined time constant on the rising or falling edge of a signal, or capacitance elements for stabilizing a reference voltage.

What is claimed is:

1. A semiconductor device comprising:
   a first region including memory cells;
   a second region including a functional circuit;
   a cell capacitor formed in the first region; and
   a compensation capacitance element formed in the second region,
   wherein the compensation capacitance element includes a lower electrode, a capacitance insulating film, and an upper electrode, the lower electrode, capacitance insulating film, and upper electrode being the same as those of the cell capacitor, and
   wherein the compensation capacitance elements are formed over an upper layer of the second region excluding upper layer portions of drain diffusion layers or gate electrodes of transistors in the functional circuit.

2. The semiconductor device according to claim 1, wherein the compensation capacitance elements are formed above at least one of a sub-contact region and a well contact region of the transistor forming the functional circuit, and a source diffusion layer of the transistor.

3. The semiconductor device according to claim 1, wherein the compensation capacitance elements are formed in a third region not including the functional circuit and the second region.

4. The semiconductor device according to claim 1, wherein one of electrodes of the compensation capacitance element is connected to a ground wiring and the other electrode is connected to a power supply wiring.

5. The semiconductor device according to claim 1, wherein the capacitance insulating film of the compensation capacitance element is formed along side walls and a bottom face of a channel formed on a layer including the compensation capacitance element.

6. The semiconductor device according to claim 5, wherein the cell capacitor includes a capacitor film that is formed along side walls and a bottom face of a channel formed on a layer including the cell capacitor.

7. The semiconductor device according to claim 1, wherein the memory cells constitute a Dynamic Random Access Memory (DRAM).

* * * * *